US012610838B2

(12) United States Patent
Hu et al.

(10) Patent No.: US 12,610,838 B2
(45) Date of Patent: Apr. 21, 2026

(54) COMPONENT-EMBEDDED PACKAGING STRUCTURE

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW); Chih-Kuai Yang, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 373 days.

(21) Appl. No.: 18/469,450

(22) Filed: Sep. 18, 2023

(65) Prior Publication Data

US 2024/0096838 A1     Mar. 21, 2024

(30) Foreign Application Priority Data

Sep. 20, 2022    (TW) ................................... 111135594

(51) Int. Cl.
| | |
|---|---|
| *H10W 70/685* | (2026.01) |
| *H10W 70/65* | (2026.01) |
| *H10W 70/66* | (2026.01) |
| *H10W 72/30* | (2026.01) |
(Continued)

(52) U.S. Cl.
CPC ......... *H10W 70/685* (2026.01); *H10W 70/65* (2026.01); *H10W 70/66* (2026.01); *H10W 74/111* (2026.01); *H10W 90/00* (2026.01); *H10W 72/322* (2026.01);
(Continued)

(58) Field of Classification Search
CPC ................. H01L 24/29; H01L 23/3107; H01L 23/49822; H01L 23/49838; H01L 23/49866; H01L 24/08; H01L 24/32; H01L 25/0655; H01L 25/16; H01L 24/16; H01L 2224/08235; H01L 2224/08238; H01L 2224/16227; H01L 2224/16238; H01L 2224/29084; H01L 2224/29139; H01L 2224/29155; H01L 2224/29166; H01L 2224/2957; H01L 2224/32227; H01L 2224/32238; H01L 2924/35121; H01L 23/13; H01L 23/49548; H01L 23/36; H01L 21/56; H01L 23/3128; H01L 23/49805;
(Continued)

(56) References Cited

U.S. PATENT DOCUMENTS

2020/0350285 A1*  11/2020  Ho ...................... H10W 70/695

* cited by examiner

*Primary Examiner* — Mohammad A Rahman
(74) *Attorney, Agent, or Firm* — Studebaker Brackett PLLC

(57) ABSTRACT

A component-embedded packaging structure is provided, in which a plurality of metal layers are formed on an inactive surface of a semiconductor chip so as to serve as a buffer portion, and the semiconductor chip is disposed on a carrying portion with the buffer portion via an adhesive. Then, the semiconductor chip is encapsulated by an insulating layer, and a build-up circuit structure is formed on the insulating layer and electrically connected to the semiconductor chip. Therefore, the buffer portion can prevent delamination from occurring between the semiconductor chip and the adhesive on the carrying portion if the semiconductor chip has a CTE (Coefficient of Thermal Expansion) less than a CTE of the adhesive.

8 Claims, 7 Drawing Sheets

(51) Int. Cl.
*H10W 74/10* (2026.01)
*H10W 90/00* (2026.01)

(52) U.S. Cl.
CPC ........ *H10W 72/352* (2026.01); *H10W 90/724*
(2026.01); *H10W 90/734* (2026.01); *H10W
90/794* (2026.01)

(58) Field of Classification Search
CPC ..... H01L 25/0657; H01L 24/24; H01L 24/19;
H01L 23/5389; H01L 24/82
See application file for complete search history.

1

13
12
10
91
90

COMPONENT-EMBEDDED PACKAGING STRUCTURE

CROSS-REFERENCE TO RELATED APPLICATIONS

This application claims priority to Taiwan Patent Application No. 111135594, filed on Sep. 20, 2022. The entirety of the above-mentioned patent application is hereby incorporated by reference herein and made a part of this specification.

BACKGROUND

1. Technical Field

The present disclosure relates to semiconductor packaging processes, and more particularly, to a component-embedded packaging structure for improving reliability.

2. Description of Related Art

Along with improved functions of electronic products and demands for energy conservation and efficiency improvement, semiconductor power chips and power management chips are developed toward modularity for improving performance. Accordingly, packaging techniques have gradually progressed from conventional wire bonding using such as gold or copper wires or solder flip-chip packaging to chip-embedded packaging so as to improve electrical performance.

FIG. 1 is a schematic cross-sectional view of a conventional chip-embedded packaging structure 1. Referring to FIG. 1, a semiconductor chip 10 is disposed on a carrier 90 via an adhesive 91, an insulating layer 12 is formed to encapsulate the semiconductor chip 10, and a build-up circuit structure 13 is formed on the insulating layer 12 and electrically connected to the semiconductor chip 10.

However, since the semiconductor chip 10 (especially a high power chip) is embedded in the insulating layer 12, due to a large difference of CTE (Coefficient of Thermal Expansion) between the semiconductor chip 10 and the adhesive 91, a poor bonding force is formed between the semiconductor chip 10 and the adhesive 91 under the effect of thermal stresses. As such, delamination may occur between the semiconductor chip 10 and the adhesive 91.

Conventionally, a metallized film can be formed on an inactive surface of the semiconductor chip to overcome the above-described drawbacks. The metallized film usually consists of two metal layers such as titanium/silver (Ti/Ag) or three metal layers such as titanium/nickel/silver (Ti/Ni/Ag). Although the metallized film can improve the bonding force and enhance heat conduction and dissipation, delamination may still occur during packaging of a high power chip with high heat dissipation requirement.

Therefore, how to overcome the above-described drawbacks has become critical.

SUMMARY

In view of the above-described drawbacks of the prior art, the present disclosure provides a component-embedded packaging structure, which comprises: a carrier structure comprising a carrying portion, an insulating layer formed on the carrying portion, a plurality of conductive structures embedded in the insulating layer, and a build-up circuit structure formed on the insulating layer, wherein the carrying portion comprises at least one patterned circuit layer and an insulating material bonded to the patterned circuit layer, and the patterned circuit layer is electrically connected to the build-up circuit structure via the conductive structures; and at least one semiconductor chip having an active surface and an inactive surface opposing the active surface and embedded in the insulating layer, wherein the semiconductor chip is electrically connected to the build-up circuit structure via the active surface, wherein the inactive surface of the semiconductor chip is metallized into a plurality of metal layers and disposed on the carrying portion via an adhesive, and the plurality of metal layers comprise a first titanium layer, a nickel layer, a second titanium layer and a silver layer sequentially stacked from inside to outside.

In the aforementioned component-embedded packaging structure, the semiconductor chip is electrically connected to the build-up circuit structure via copper conductors.

In the aforementioned component-embedded packaging structure, the conductive structures are conductive posts and/or conductive through vias.

In the aforementioned component-embedded packaging structure, the semiconductor chip is bonded to a metal portion or an insulating portion of the carrying portion.

In the aforementioned component-embedded packaging structure, the carrying portion has a plurality of the patterned circuit layers that are stacked and electrically connected together.

In the aforementioned component-embedded packaging structure, the carrying portion and/or the build-up circuit structure have a plurality of exposed electrode pads for bonding with an external element. For example, a curved recess is formed at a side edge of the exposed electrode pad of the carrying portion. Alternatively, the external element comprises one of an active element, a passive element, a conductive bump and a solder ball, or a combination thereof.

According to the component-embedded packaging structure of the present disclosure, the plurality of metal layers serve as a buffer portion between the semiconductor chip and the adhesive so as to prevent delamination from occurring therebetween due to an environmental impact. Therefore, compared with the prior art, the component-embedded packaging structure of the present disclosure can effectively disperse thermal stresses and improve the bonding force between the semiconductor chip and the adhesive. As such, the present disclosure avoids delamination that otherwise could occur due to a poor bonding force between the semiconductor chip and the adhesive and improves the reliability of the component-embedded packaging structure.

DETAILED DESCRIPTION

The following illustrative embodiments are provided to illustrate the present disclosure. Those skilled in the art can easily understand other advantages and effects of the present disclosure from the contents disclosed in this specification.

It should be noted that the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable purposes should still be deemed as falling within the scope defined by the technical contents disclosed in the present specification. Meanwhile, terms such as "on," "first," "second," "a," "one," etc. are merely used for clear explanation rather than limiting the practicable scope of the present disclosure, and thus, alterations or adjustments of the relative relationships thereof without essentially altering the technical contents should still be considered in the practicable scope of the present disclosure.

Figure 1:
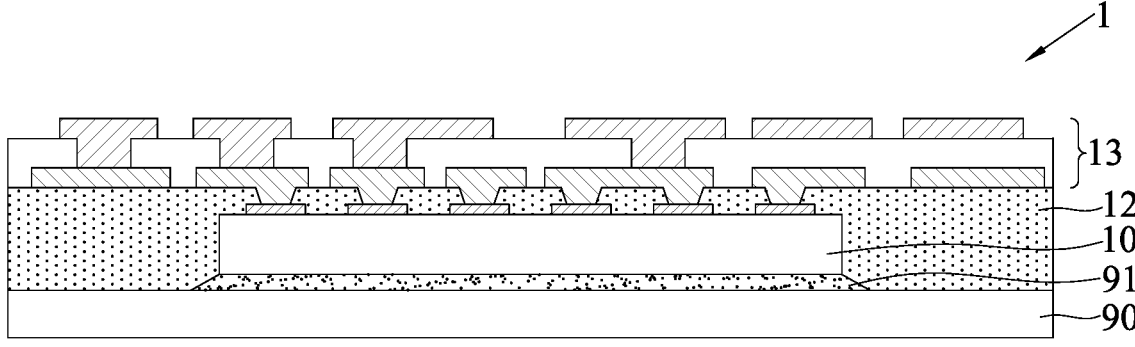
FIG. 1 is a schematic cross-sectional view of a conventional chip-embedded packaging structure.
Figure 2A:
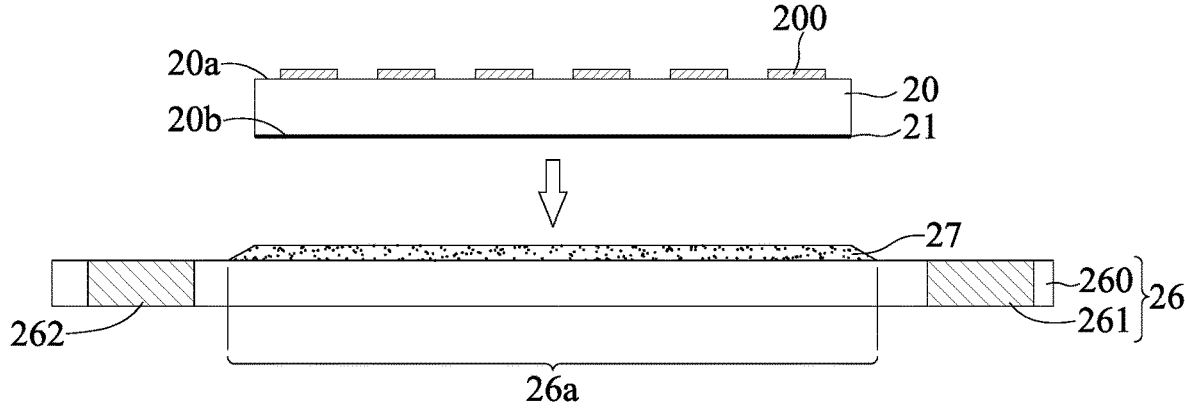
FIG. 2A to FIG. 2C are schematic cross-sectional views illustrating a method for fabricating a component-embedded packaging structure according to the present disclosure.
Figure 2B:
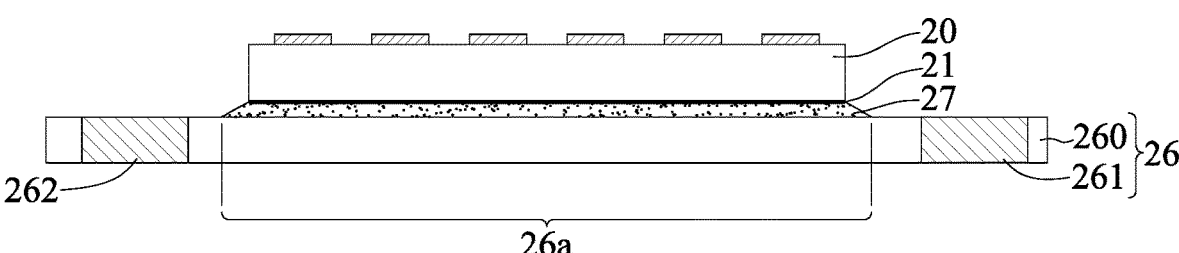
Figure 2C:
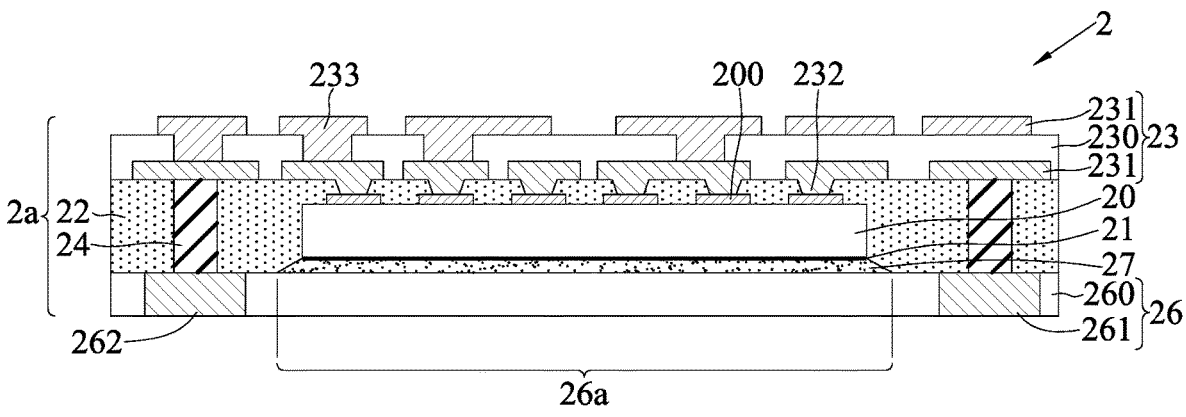

FIG. 2A to FIG. 2C are schematic cross-sectional views illustrating a method for fabricating a component-embedded packaging structure 2 according to the present disclosure. In an embodiment, the packaging structure 2 is fabricated by using large panel level packaging (PLP) techniques.

Referring to FIG. 2A, a carrying portion 26 and a semiconductor chip 20 are provided. The semiconductor chip 20 has an active surface 20a and an inactive surface 20b opposing the active surface 20a, and a plurality of contacts 200 are formed on the active surface 20a. The inactive surface 20b of the semiconductor chip 20 is metallized by deposition, sputtering, chemical vapor deposition (CVD), or electroplating so as to form a plurality of metal layers. The metal layers serve as a buffer portion 21.

Figure 5:
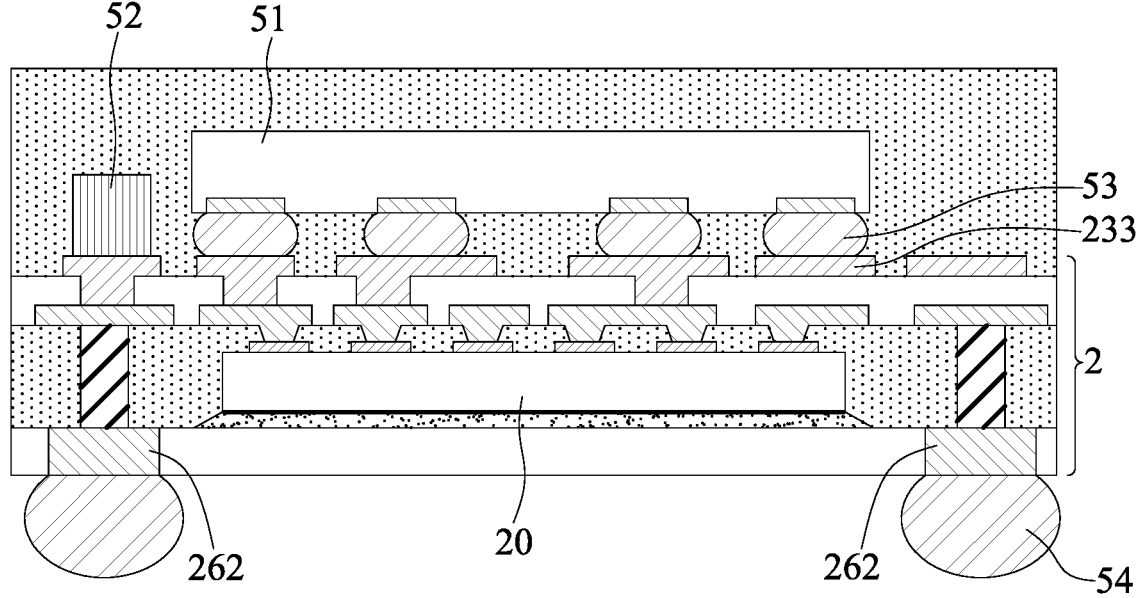
FIG. 5 is a schematic cross-sectional view showing application of FIG. 2C.

In an embodiment, the carrying portion 26 has at least one patterned circuit layer 261 and an insulating material 260 bonded to the circuit layer 261. The circuit layer 261 of the carrying portion 26 has a plurality of exposed electrode pads 262 for bonding with external elements such as an active element 51, a passive element 52, conductive bumps 53, solder balls 54, or a combination thereof, as shown in FIG. 5. For example, the carrying portion 26 is a packaging substrate having a core layer and a circuit structure, or a coreless circuit structure, and the circuit layer 261 such as a fan-out type redistribution layer (RDL) is formed on a dielectric material. Further, the carrying portion 26 can be made of other base materials for carrying electronic elements such as semiconductor chips. For example, the carrying portion 26 is a metal (such as copper, aluminum, nickel, SUS [Steel Use Stainless]) patterned structural ceramic or a multilayer routing/wiring structure, but the present disclosure is not limited to as such.

Figure 3A:
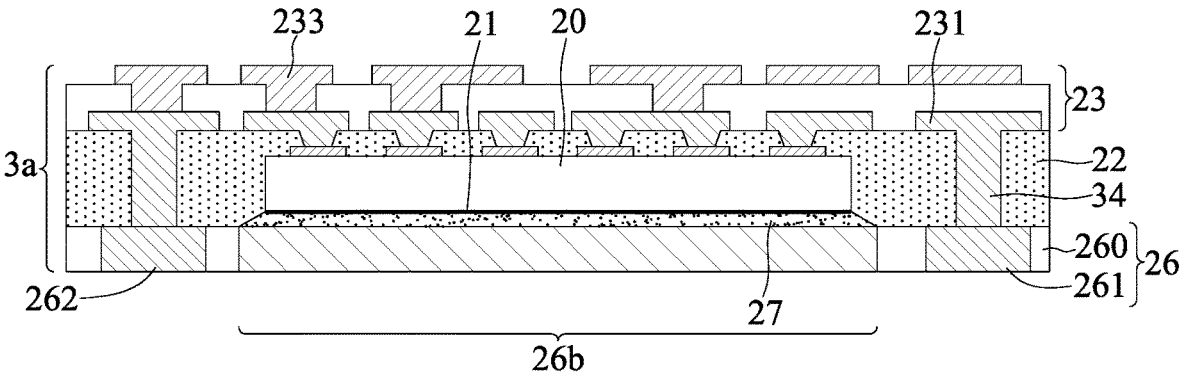
FIG. 3A to FIG. 3C are schematic cross-sectional views showing different embodiments of FIG. 2C.

Further, the semiconductor chip 20 is bonded to an insulating portion 26a of the insulating material 260 of the carrying portion 26, and an adhesive 27 is disposed with a substantially even thickness on the carrying portion 26 corresponding in position to the semiconductor chip 20. As such, the layout area of the adhesive 27 is substantially equal to the layout area of the buffer portion 21 (or the area of the inactive surface 20b of the semiconductor chip 20). Alternatively, referring to FIG. 3A, the semiconductor chip 20 can be bonded to a metal portion 26b of the circuit layer 261 of the carrying portion 26.

Figure 2D:
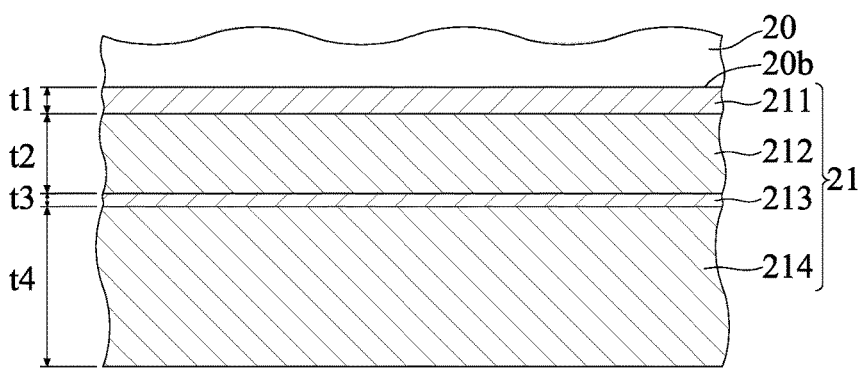
FIG. 2D is a schematic partially enlarged cross-sectional view of a buffer portion of FIG. 2C.

Furthermore, the buffer portion 21 is formed on the inactive surface 20b of the semiconductor chip 20 for use as a metal buffer and adhesive interface. The buffer portion 21 is made of a composite metal combination. Referring to FIG. 2D, the buffer portion 21 has a plurality of metal layers stacked on one another. For example, the buffer portion 21 has four metal layers including a first titanium layer 211, a nickel layer 212, a second titanium layer 213 and a silver layer 214 that are sequentially stacked on the inactive surface 20b of the semiconductor chip 20 from inside to outside.

The first titanium layer 211 has a thickness t1 of 0.01 μm to 2 μm, the nickel layer 212 has a thickness t2 of 0.01 μm to 2 μm, the second titanium layer 213 has a thickness t3 of 0.0001 μm to 2 μm, and the silver layer 214 has a thickness t4 of 0.01 μm to 10 μm. The thicknesses of the metal layers of the buffer portion 21 can be designed according to requirements without any special limitation. Therefore, the thicknesses t1 to t4 of the first titanium layer 211, the nickel layer 212, the second titanium layer 213 and the silver layer 214 can be adjusted according to requirements of the packaging type and are not limited to the above.

Further, the buffer portion 21 can be made of various metal combinations such as titanium/nickel/titanium/silver, titanium/nickel/silver/nickel, titanium/nickel/titanium/gold, titanium/gold/titanium/nickel/vanadium/gold, and the present disclosure is not limited to as such. Preferably, the buffer portion 21 is made of titanium/nickel/titanium/silver.

Referring to FIG. 2B, the semiconductor chip 20 is bonded to the adhesive 27 on the carrying portion 26 via the buffer portion 21 thereon.

In an embodiment, the adhesive 27 is a thermal conductive silver adhesive for connecting the semiconductor chip 20 and the carrying portion 26, and the adhesive 27 is usually baked at 180° C. to 270° C.

Referring to FIG. 2C, an insulating layer 22 is formed on the carrying portion 26 to encapsulate the semiconductor chip 20. Then, a build-up circuit structure 23 is formed on the insulating layer 22 and electrically connected to the contacts 200 of the active surface 20a of the semiconductor chip 20, and a plurality of conductive structures 24 are embedded in the insulating layer 22 to electrically connect the carrying portion 26 and the build-up circuit structure 23. As such, a carrier structure 2a is obtained, which has the insulating layer 22 formed on the carrying portion 26, the plurality of conductive structures 24 embedded in the insulating layer 22, and the build-up circuit structure 23 formed on the insulating layer 22.

In an embodiment, the insulating layer 22 is made of a packaging material such as polyimide (PI), ABF (Ajinomoto Build-up Film), a photosensitive organic material, an epoxy molding compound (EMC), or the like, and the present disclosure is not limited to as such. For example, the insulating layer 22 is formed on the carrying portion 26 by lamination or molding.

Further, a plurality of openings can be formed on the insulating layer 22 to expose the contacts 200, thereby facilitating connection of the build-up circuit structure 23 to the contacts 200. Preferably, the semiconductor chip 20 is electrically connected to the build-up circuit structure 23 via copper conductors 232.

Furthermore, the build-up circuit structure 23 has at least one dielectric layer 230 and at least one redistribution layer 231 bonded to the dielectric layer 230. The redistribution layer 231 can be electrically connected to the contacts 200 of the semiconductor chip 20 via conductive blind-vias or conductive posts (such as the copper conductors 232), and a plurality of exposed electrode pads 233 are formed on the outermost redistribution layer 231 of the build-up circuit structure 23 for bonding with external elements such as the active element 51, the passive element 52, the conductive bumps 53, the solder balls 54, or a combination thereof, as shown in FIG. 5. For example, the redistribution layer 231 is made of copper, and the dielectric layer 230 is made of a dielectric material such as ABF, a photosensitive organic material, EMC, polybenzoxazole (PBO), polyimide (PI), prepreg (PP), or the like.

Figure 3B:
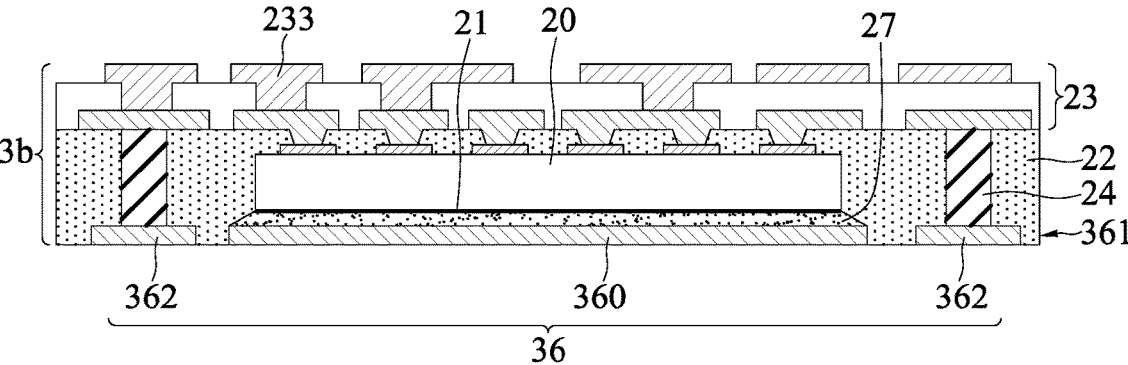

In addition, the conductive structures 24 are conductive posts (as shown in FIG. 2C) and/or conductive through vias (as shown in a carrier structure 3a of FIG. 3A, conductive structures 34 and the redistribution layer 231 are integrally formed), and the circuit layer 261 of the carrying portion 26 is electrically connected to the build-up circuit structure 23 via the conductive structures 24. In another embodiment, a carrying portion 36 can be embedded in the insulating layer 22. Referring to FIG. 3B, a carrier structure 3b has a metal portion 360 (serving as a chip bonding pad) for carrying the semiconductor chip 20 and a circuit layer 361 (with a plurality of electrode pads 362) allowing the conductive structures 24 to be disposed and electrically connected to the circuit layer 361. The insulating material 260 is a portion of the insulating layer 22.

Figure 3C:
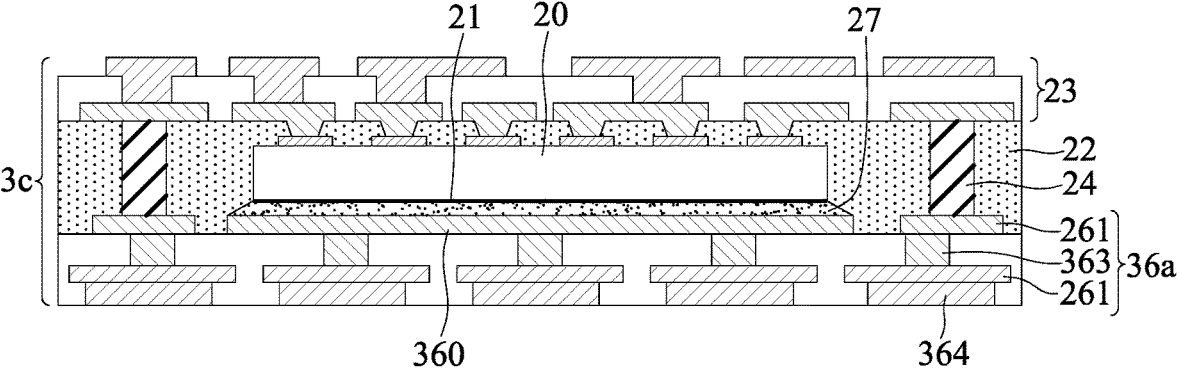

It can be understood that a carrying portion 36a can have a plurality of the patterned circuit layers 261 that are stacked and electrically connected together. Referring to FIG. 3C, a carrier structure 3c has a plurality of conductive blind-vias or conductive posts 363 for electrically connecting the circuit layers 261, and a plurality of exposed electrode pads 364 are formed on the outermost circuit layer 261 for connecting with external elements.

Therefore, in the present disclosure, a plurality of metal layers as the buffer portion 21 are used between the semiconductor chip 20 and the adhesive 27 so as to prevent delamination from occurring therebetween due to an environmental impact. Therefore, compared with the prior art, the component-embedded packaging structure 2 of the present disclosure can improve the bonding force between the semiconductor chip 20 and the carrying portion 26, 36, 36a, thereby improving the reliability of the packaging structure 2.

Further, if four metal layers including the first titanium layer 211, the nickel layer 212, the second titanium layer 213 and the silver layer 214 serve as the buffer portion 21, the buffer portion 21 can also be used as an adhesive conductive interface for improving the bonding force and the reliability.

Figure 4A:
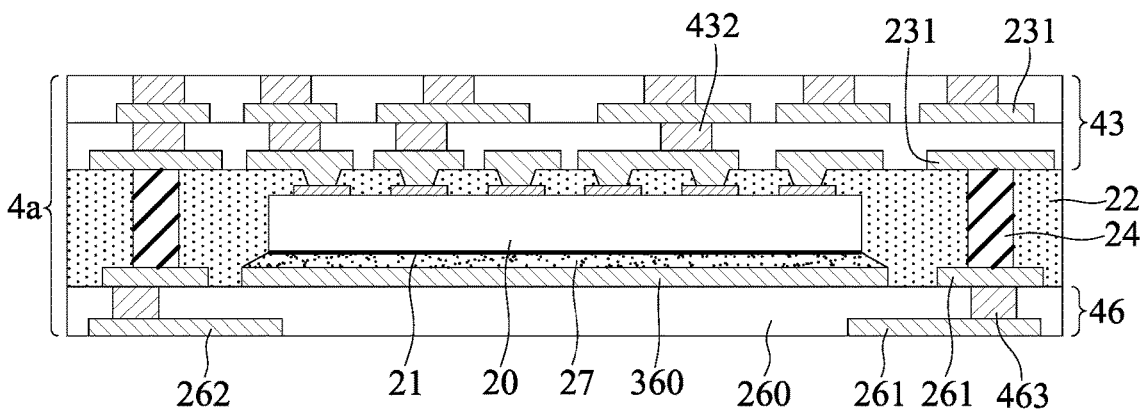
FIG. 4A and FIG. 4B are schematic cross-sectional views showing different embodiments of FIG. 2C.
Figure 4B:
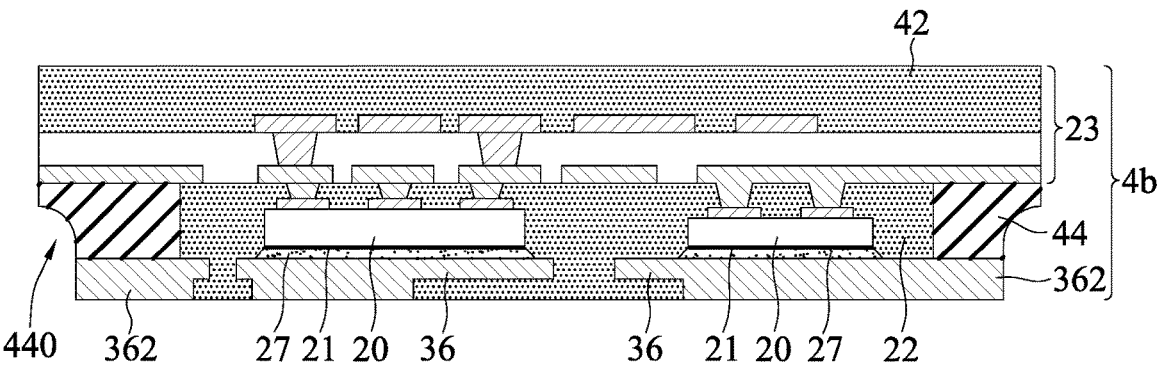

In addition, various processes for fabricating the carrying portion 26, the conductive structures 24 and the build-up circuit structure 23 of the packaging structure 2 can be chosen according to needs. For example, the fabrication process of conductive blind-vias can be replaced by a fabrication process of conductive posts. Referring to a carrier structure 4a of FIG. 4A, the upper and lower circuit layers 261 (or the redistribution layers 231) are electrically connected by conductive posts 463 (or conductive posts 432) of a carrying portion 46 (or a build-up circuit structure 43). Alternatively, for instance, conductive structures 44 can be connected to the carrying portion 36 and exposed from a side of the insulating layer 22. Referring to a carrier structure 4b of FIG. 4B, a curved recess 440 is formed at a side edge of the exposed electrode pad 362, and the redistribution layer 231 is covered by an insulating protection layer 42. As such, the carrying portion 36 serves as an electrical connection pad layer such as an LGA (Land Grid Array) packaging type bonding pad. When the electrode pads 362 of the packaging structure 2 are mounted onto a circuit board (not shown) by a solder material, the bonding condition of the solder material can be optically inspected through the recess

440, thus avoiding the problem of poor quality when installing an automotive electronic component (not shown) using the packaging structure 2.

The present disclosure provides a component-embedded packaging structure 2, which has a carrier structure 2a, 3a, 3b, 3c, 4a, 4b and at least one semiconductor chip 20 embedded in the carrier structure 2a, 3a, 3b, 3c, 4a, 4b.

The carrier structure 2a, 3a, 3b, 3c, 4a, 4b has a carrying portion 26, 36, 36a, 46, an insulating layer 22 formed on the carrying portion 26, 36, 36a, 46, a plurality of conductive structures 24, 34, 44 embedded in the insulating layer 22, and a build-up circuit structure 23, 43 formed on the insulating layer 22, wherein the carrying portion 26, 36, 36a, 46 has at least one patterned circuit layer 261, 361 and an insulating material 260 bonded to the circuit layer 261, 361, and the circuit layer 261, 361 is electrically connected to the build-up circuit structure 23, 43 via the conductive structures 24, 34, 44.

The semiconductor chip 20 is embedded in the insulating layer 22 and electrically connected to the build-up circuit structure 23, 43, and an inactive surface 20b of the semiconductor chip 20 is metallized into a plurality of metal layers so as to serve as a buffer portion 21. The inactive surface 20b of the semiconductor chip 20 having the plurality of metal layers is disposed on the carrying portion 26, 36, 36a, 46 via an adhesive 27, wherein the plurality of metal layers include a first titanium layer 211, a nickel layer 212, a second titanium layer 213 and a silver layer 214 sequentially stacked from inside to outside.

In an embodiment, the semiconductor chip 20 is electrically connected to the build-up circuit structure 23 via copper conductors 232.

In an embodiment, the conductive structures 24, 34 are conductive posts and/or conductive through vias.

In an embodiment, the semiconductor chip 20 is bonded to a metal portion 26b, 360 or an insulating portion 26a of the carrying portion 26, 36, 36a, 46.

In an embodiment, the carrying portion 46 has a plurality of the patterned circuit layers 261 that are stacked and electrically connected together.

In an embodiment, the carrying portion 26, 36, 36a, 46 and/or the build-up circuit structure 23, 43 have a plurality of exposed electrode pads 233, 262, 362, 364 for bonding with an external element. For example, a curved recess 440 is formed at a side edge of the exposed electrode pad 362 of the carrying portion 36. Alternatively, the external element comprises one of an active element 51, a passive element 52, a conductive bump 53 and a solder ball 54, or a combination thereof.

In summary, in the component-embedded packaging structure according to the present disclosure, the inactive surface of the semiconductor chip is metallized into a plurality of metal layers so as to serve as a buffer portion. As such, the present disclosure overcomes the drawback of poor bonding force between the semiconductor chip and the adhesive caused by a big CTE difference. Therefore, the component-embedded packaging structure of the present disclosure can be advantageously applied to products with high power management integrated circuits (PMICs) and high heat dissipation requirements and even applied to products with high reliability requirements.

The above-described descriptions of the detailed embodiments illustrate the implementations according to the present disclosure, and it is not to limit the scope of the present disclosure. Accordingly, all modifications and variations completed by those with ordinary skill in the art should fall within the scope of present disclosure defined by the appended claims

What is claimed is:

1. A component-embedded packaging structure, comprising:

a carrier structure comprising a carrying portion, an insulating layer formed on the carrying portion, a plurality of conductive structures embedded in the insulating layer, and a build-up circuit structure formed on the insulating layer, wherein the carrying portion comprises at least one patterned circuit layer and an insulating material bonded to the at least one patterned circuit layer, and the at least one patterned circuit layer is electrically connected to the build-up circuit structure via the plurality of conductive structures; and at least one semiconductor chip having an active surface and an inactive surface opposing the active surface and embedded in the insulating layer, wherein the at least one semiconductor chip is electrically connected to the build-up circuit structure via the active surface, wherein the inactive surface of the at least one semiconductor chip is metallized into a plurality of metal layers and disposed on the carrying portion via an adhesive, and the plurality of metal layers comprise a first titanium layer, a nickel layer, a second titanium layer and a silver layer sequentially stacked from inside to outside.

2. The component-embedded packaging structure of claim 1, wherein the at least one semiconductor chip is electrically connected to the build-up circuit structure via copper conductors.

3. The component-embedded packaging structure of claim 1, wherein the plurality of conductive structures are conductive posts and/or conductive through vias.

4. The component-embedded packaging structure of claim 1, wherein the at least one semiconductor chip is bonded to a metal portion or an insulating portion of the carrying portion.

5. The component-embedded packaging structure of claim 1, wherein the carrying portion has a plurality of the at least one patterned circuit layer that are stacked and electrically connected together.

6. The component-embedded packaging structure of claim 1, wherein the carrying portion and/or the build-up circuit structure have a plurality of exposed electrode pads for bonding with an external element.

7. The component-embedded packaging structure of claim 6, wherein a curved recess is formed at a side edge of the exposed electrode pad of the carrying portion.

8. The component-embedded packaging structure of claim 6, wherein the external element comprises one of an active element, a passive element, a conductive bump and a solder ball, or a combination thereof.

* * * * *